United States Patent [19]

Lowell

[11] Patent Number: 5,054,076
[45] Date of Patent: Oct. 1, 1991

[54] KEY-ACTUATED VOLUME CONTROL

[75] Inventor: Wilhelm R. Lowell, St. Louis, Mo.

[73] Assignee: Lowell Manufacturing Company, St. Louis, Mo.

[21] Appl. No.: 435,668

[22] Filed: Nov. 13, 1989

[51] Int. Cl.⁵ .............................................. H03G 3/00
[52] U.S. Cl. ...................................... 381/109; 381/82
[58] Field of Search ............... 200/43.08, 43.11, 43.15; 381/105, 82, 85, 104, 109; 336/149, 150; 379/445

[56] References Cited

U.S. PATENT DOCUMENTS

| | | | |
|---|---|---|---|
| 1,424,863 | 8/1922 | Walker et al. | 200/43.22 |
| 2,176,732 | 10/1939 | Faber | 381/85 |
| 2,769,873 | 11/1956 | Noregaard | 200/43.08 |
| 2,856,474 | 10/1958 | Norris | 200/43.08 |
| 3,372,251 | 3/1968 | Bowman et al. | 200/43.22 |
| 4,584,856 | 4/1986 | Petersdorff et al. | 379/445 |
| 4,644,111 | 2/1987 | Hammond | 200/43.08 |

FOREIGN PATENT DOCUMENTS 564625 1/1924 France ................................. 381/85

OTHER PUBLICATIONS

Allied Electronics Catalog, 1986, p. 561.

Primary Examiner—Forester W. Isen
Attorney, Agent, or Firm—Kalish & Gilster

[57] ABSTRACT

A device for providing limited-access volume control for at least one remote speaker in an audio system, the device comprising a lockable, key-actuable attenuator that attenuates an input audio signal to provide an attenuated output audio signal. The attenuator is adjustable upon the insertion of a key to selectively adjust the degree of attenuation, and is lockable upon the removal of the key to prevent unauthorized adjustment of the degree of attenuation. The attenuator preferably comprises a transformer having primary and secondary windings. A plurality of tap means is connected to the secondary winding. A lockable, key-actuable, multiple position switch, having a contact corresponding to each switch position, is connected to the tap means with each contact being connected to one of the tap means. The switch can be operated upon insertion of a key to move from position to position and can be locked upon removal of the key.

10 Claims, 2 Drawing Sheets

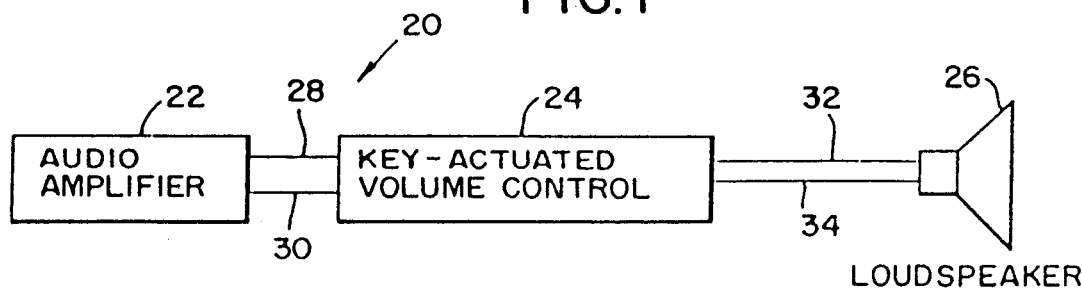
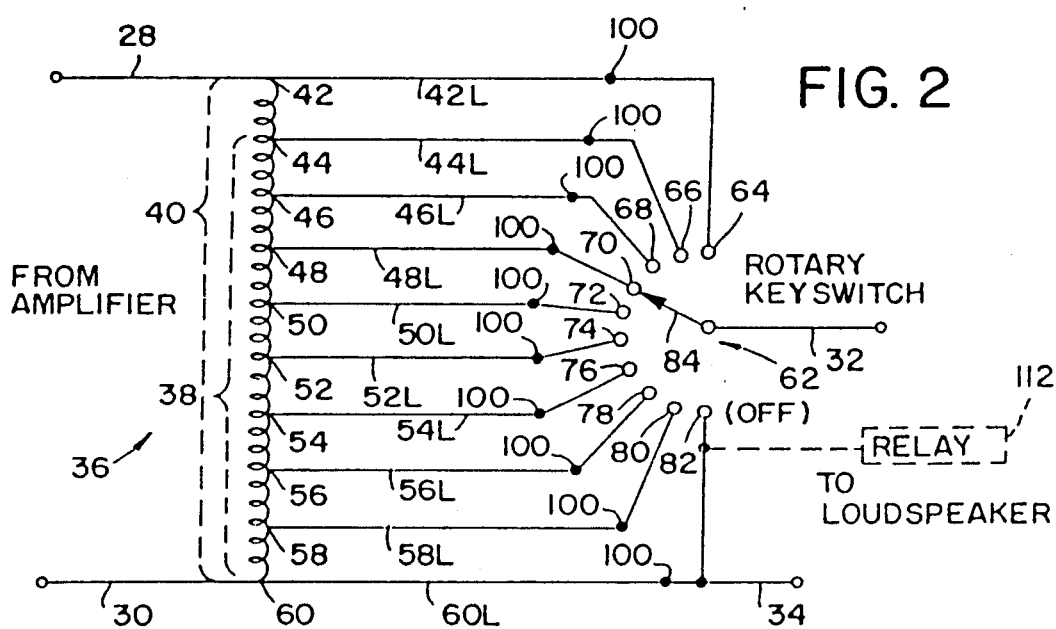
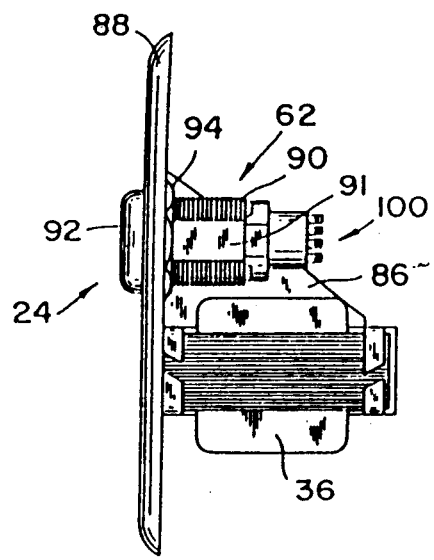
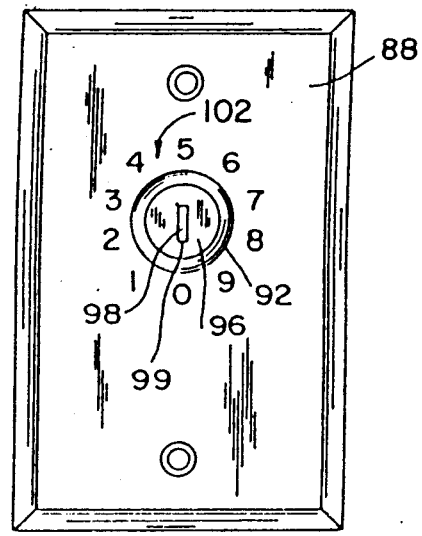

KEY-ACTUATED VOLUME CONTROL

BACKGROUND OF THE INVENTION

This invention relates to a key-actuated volume control and more particularly to a key-actuated volume control for adjusting the volume of a remote speaker or speakers in a sound system.

Sound systems installed in buildings include audio components which provide audio signals to speakers. The audio components are typically located in one central location while the speakers are located at various remote points throughout the building. Often there is no way to control the volume level at the individual speakers or groups of speakers and if there is provision for adjusting the volume at the remote speakers, generally it is located with the audio components at the central location. It is extremely difficult to selectively adjust the speaker volume at selective remote locations to the desired level when the controls are at a central location. Moreover, in many instances it is not desirable to provide a volume control at the remote speaker locations because unauthorized persons might tamper with the controls, damaging the speaker and controls or turning the controls off, blocking the flow of potentially important information (for examples warnings and alarms).

SUMMARY OF THE INVENTION

Among the objects of the present invention is the provision of a key-actuated volume control for controlling the volume of the speakers in a sound system which are located remotely from the centrally located audio components; the provision of such a key-actuated volume control which is of simple construction for low cost and highly reliable operation; the provision of such a key-actuated volume control that can be easily retrofit to existing sound systems and that can be easily incorporated into new sound systems; and the provision of such a key-actuated volume control that can be quickly and easily operated.

The key-actuated volume control of the present invention is adapted to provide limited-access volume control for at least one remote speaker in an audio system comprising an audio signal source and at least one remote speaker. Generally, the device comprises a lockable, key-actuable attenuator that attenuates an input audio signal to provide an attenuated output audio signal. The attenuator is adjustable upon the insertion of a key to selectively adjust the degree of attenuation, and is lockable upon the removal of the key to prevent unauthorized adjustment of the degree of attenuation. The device further comprises means for providing an input audio signal from the audio signal source to the attenuator, and means for providing an output signal from the attenuator to the speaker.

The attenuator preferably comprises a transformer having primary and secondary windings. The primary winding is connected to the means for providing an input audio signal. A plurality of tap means are connected to the secondary winding. The attenuator further comprises a lockable, key-actuable, multiple position switch having a plurality of contacts, with one contact corresponding to each switch or stepped position. Each of the switch contacts is connected to one of the tap means. The switch is operable upon insertion of a key to move from position to position to selectively contact each of the various tap means, and the switch is lockable upon removal of the key.

The device thus provides for limited access volume control for at least one remote speaker in a sound system. The device is of simple construction for low cost and highly reliable operation. The device can be easily retrofit to existing sound systems or incorporated into new systems. The device is easy to use.

Other objects and features will be in part apparent and in part pointed out hereinafter.

BRIEF DESCRIPTION OF THE DRAWINGS

FIG. 1 is a block diagram showing a key-actuated volume control of the present invention connected in a sound system;

FIG. 2 is a schematic diagram of the key-actuated volume control;

FIG. 3 is a side elevation view of the key-actuated volume control;

FIG. 4 is a front elevation view of the key-actuated volume control; and

Corresponding reference characters indicate corresponding parts throughout the several views of the drawings.

DETAILED DESCRIPTION OF THE PREFERRED EMBODIMENT

Figure 5:
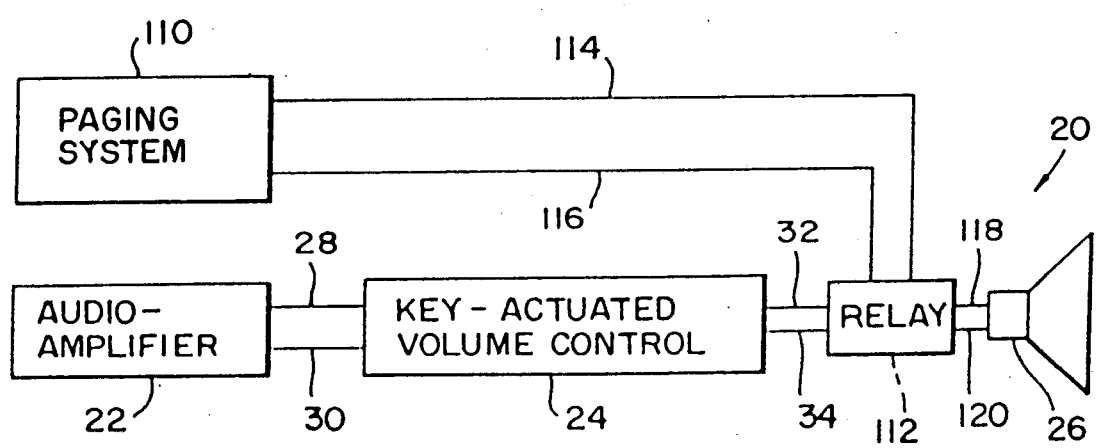
FIG. 5 is a block diagram of the key-actuated volume control connected to a paging system.

Referring now to FIG. 1, there is shown a block diagram of a sound system 20 including an audio amplifier 22, a key-actuated volume control 24, and a loudspeaker 26 (speaker). The sound system 20 may be installed, for example, in a building such as a warehouse. There may be one or more speakers 26 installed in various locations in the building remote from the audio amplifier 22. Audio signals are supplied to the audio amplifier 22 from a receiver (not shown) or other audio signal device or source. The signals are in turn supplied from the audio amplifier 22 to the key-actuated volume control 24 via lines 28 and 30. The volume control 24 then supplies the signals to the loudspeaker 26 via lines 32 and 34. The signal or volume level at a particular speaker 26 is adjusted by its associated volume control 24. Although one key-actuated volume control 24 is shown in FIG. 1, it is to be understood that there may be a plurality of controls 24 located throughout the building, each controlling one or more speakers 26. These controls 24 are preferably located adjacent to or near the speakers 26 that they control.

FIG. 2 illustrates a schematic diagram of the key-actuated volume control 24. Volume control 24 includes an autotransformer 36 having a primary winding 38 and a secondary winding 40 i.e., being effectively primary and secondary portions of a single common winding. The primary winding 38 is connected to the audio amplifier 22 via lines 28 and 30. The secondary winding 40 is tapped off at various points along the winding by taps 42-60. The taps 42-60 are examples of tap means. A lockable, multiple-position rotary key switch 62, having a contacts 64-82, one for each switch position, is coupled to the taps with each contact being connected to one of the taps. The taps 42-60 are connected by lines 42L-60L, respectively, to leads 100 on the switch 62. Each one of the leads 100 corresponds and connects to one of the contacts 64-82.

The switch 62 includes a contact arm 84 which, when a key is inserted into the switch, may be selectively positioned to contact one of the contacts 64–82, and thereby contact one of the taps 42–60 to provide a selected portion of the available signal to provide a degree of attenuation of the signal, and thus the volume level. If for example the contact arm 84 is in contact with contact 64 to contact tap 42 then full volume or all of the signal from the audio amplifier (less line loss) is supplied to the loudspeaker 26, without further attenuation. If the contact arm 84 is in contact with contact 82 to contact tap 60, then the signal from the audio amplifier will not be sent to the loudspeaker 26. This represents the off condition or no volume, and if the contact arm 84 is in contact with one of the contacts 66–80 to contact taps 44–60, respectively, then the signal from the audio amplifier 24 (less line loss) will be reduced by varying degrees before it is sent to the loudspeaker 26. Additionally, the position of the contact arm 84 defines the secondary winding 40 of the autotransformer 36.

As shown in FIG. 3, the key-actuated volume control 24 is mounted in a bracket 86 which is in turn mounted on a face plate 88. The volume control 24 and the face plate 88 may be mounted to a wall or ceiling in the building. Both the autotransformer 36 and the key switch 62 are mounted to the bracket 86. The lines 42L–60L between the taps 42–60 on the autotransformer 36 and the contacts 100 on switch 62 are not shown in FIG. 3 for clarity.

Key switch 62 comprises an elongate, threaded tubular body 90 having flats 91 on two sides with an enlarged head 92 which allows the body 90 to be secured in an opening having flatted sides in the plate 88. The flatted sides receive the flats 91 of the body 90 to prevent rotation of the body 90. A mounting nut 94 is threaded on the body to sandwich the plate 88 between the enlarged head and the nut, thereby securing the switch to the plate. A cylinder 96 (FIG. 4) is rotatably mounted within the body 90. The front end of the cylinder 96 is formed with a key slot 98 (FIG. 4) to receive a key (not shown). As is well known in the art, the insertion of the key into key slot 98 releases tumblers which allows the cylinder to rotate. The cylinder 96 is locked in whatever position it is put. The cylinder 96 may include a dot 99 or other device for indicating what position the cylinder 96 has been locked. Only when the key is inserted into the key slot 98 can the cylinder 96 be rotated to a different position.

FIG. 4 shows a front view of the key-actuated volume control 24. The face plate 88 includes some indicia, for example a dial 102, with numerals "0" through "9", representing the various volume levels or emergency messages associated with the various positions of the lock 62. If for example the lock cylinder is rotated to position 3 (as indicated by the orientation of the key) then the volume will be the third level above cut-off. If for example the lock cylinder is rotated to position 0, then the volume will be off.

Additionally, the volume control 24 may be used to broadcast various emergency messages over the loudspeaker 26. FIG. 5 illustrates a block diagram of the volume control 24 connected to a paging system 110 for broadcasting an emergency message over loudspeaker 26. The paging system 110 is connected to a relay 112 via lines 114 and 116. Relay 112 is connected to the volume control 24 via lines 32 and 34. Relay 112 is also connected to the loudspeaker 26 via lines 118 and 120. In operation, positioning the contact arm 84 in contact with contact 82 will fully attenuate the signal to operate relay 112 to switch the source of the signal being supplied to the loudspeaker 26 from the audio amplifier 22 to the paging system 110. Relay 112 is responsive to switch 62 such that when switch 62 is placed in position to connect line 32 to contact 82, relay 112 connects paging system 110 to loudspeaker 26. In this manner an emergency message may be broadcasted to alert personnel in a building of a fire or other emergency condition.

OPERATION

In operation, the sound system 20 is turned on by operating its power switch (not shown) and the volume is set to a preselected level by operating its volume control switch (also not shown). If during the course of operation of the sound system 20 it is desired to adjust the volume for conditions at a particular remote speaker or a group of speakers, then the volume can be adjusted by inserting the appropriate key into the key-actuated volume control 24 for that speaker or group of speakers and turning the key to turn the lock cylinder to select the desired volume level. Removal of the key locks the volume control at the newly selected volume level. Additionally, if an emergency message needs to be broadcasted over the sound system 20, then the key can be inserted to select the appropriate emergency message or priority conditions may be incorporated to by-pass locked setting accounting for full available volume. Without the key the speaker volume or setting cannot be tampered with (except with priority feature), assuring that broadcast information will be transmitted at the selected volume level.

In view of the above, it will be seen that the several objects of the invention are achieved and other advantageous results attained.

As various changes could be made in the above constructions without departing from the scope of the invention, it is intended that all matter contained in the above description and shown in the accompanying drawings shall be interpreted as illustrative and not in a limiting sense.

What is claimed is:

1. A device for providing limited-access volume control for at least one remote speaker in an audio system comprising an audio signal source and at least one remote speaker, the device comprising:
  a lockable, key-actuable attenuator that attenuates an input audio signal to provide an attenuated output audio signal, the attenuator being adjustable by use of a key to selectively adjust the degree of attenuation, and being lockable upon the removal of the key to prevent unauthorized adjustment of the degree of attenuation,
  means for providing an input audio signal from the audio signal source to the attenuator,
  means for providing an output signal from the attenuator to the speaker,
  means for providing an emergency signal,
  the attenuator comprising a transformer connected to the means for providing an input audio signal, the transformer including a winding having a plurality of tap means for providing a corresponding plurality of levels of attenuation, and a lockable, key-actuable, multiple position switch having a contact corresponding to each switch position, each such contact being connected to a respective one of the tap means, the switch being operable upon insertion of a key to move from position to position and being lockable upon removal of the key, and one of the tap means being connected to the winding in such a way that it can enable the means for producing an emergency signal so that when the switch is operated to the position corresponding to this tap means the emergency signal is transmitted to the speaker.

2. The device according to claim 1 wherein the transformer is an autotransformer.

3. The device according to claim 1 wherein the switch includes a contact arm for selectively contacting the contacts.

4. The device according to claim 1 wherein the transformer and the switch are mounted to a face plate.

5. The device of claim 4 wherein the face plate includes means for indicating the switch position.

6. A lockable, key-actuable speaker volume control device comprising:
   a transformer having a winding,
   a plurality of tap means connected to the winding for providing a corresponding plurality of levels of attenuation,
   a lockable, key-actuable, multiple position switch having a contact corresponding to each switch position, each contact being connected to a respective one of the tap means, the switch being operable upon insertion of a key to move from position to position and being lockable upon removal of the key,
   means for providing an input volume signal to the winding,
   means for providing an output signal from the switch to the speaker,
   means for providing an emergency signal, and
   one of the tap means being connected to the secondary winding in such a way that it can enable the means for providing an emergency signal, so that when the switch is operated to the position corresponding to this tap means the emergency signal is transmitted to the speaker.

7. The device according to claim 6 wherein the switch includes a contact arm for selectively contacting the contacts.

8. The device according to claim 6 wherein the transformer and the switch are mounted to a face plate.

9. The device of claim 8 wherein the face plate includes means for indicating the switch position.

10. The device according to claim 6 wherein the transformer is an autotransformer.

* * * * *